(12) United States Patent
Ichihara et al.

(10) Patent No.: US 7,545,010 B2
(45) Date of Patent: Jun. 9, 2009

(54) CATALYTIC SENSOR STRUCTURE

(75) Inventors: Shigeru Ichihara, Kanagawa (JP);
Kaoru Konakahara, Kanagawa (JP);
Tohru Den, Tokyo (JP); Kazuhiko Fukutani, Santa Cruz, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 174 days.

(21) Appl. No.: 10/912,082

(22) Filed: Aug. 6, 2004

(65) Prior Publication Data

US 2005/0062033 A1    Mar. 24, 2005

(30) Foreign Application Priority Data

Aug. 8, 2003  (JP)  ............... 2003-290536
Aug. 8, 2003  (JP)  ............... 2003-290538

(51) Int. Cl.
*H01L 29/43*       (2006.01)
(52) U.S. Cl. .................. 257/414; 977/720; 977/764; 977/778; 977/780; 977/782; 977/957; 257/E29.07
(58) Field of Classification Search ................ 257/414
See application file for complete search history.

(56) References Cited

U.S. PATENT DOCUMENTS

| | | | | |
|---|---|---|---|---|
| 5,211,707 A | * | 5/1993 | Ditchek et al. ............. | 438/20 |
| 5,462,467 A | * | 10/1995 | Macaulay et al. ............ | 445/50 |
| 2002/0118027 A1 | * | 8/2002 | Routkevitch et al. ........ | 324/694 |
| 2002/0167013 A1 | | 11/2002 | Iwasaki et al. .............. | 257/79 |
| 2003/0175472 A1 | | 9/2003 | Den et al. ................... | 428/66.6 |

OTHER PUBLICATIONS

RC Furneaux, WR Rigby and AP Davidson, Nature International Weekly Journal of Science, Jan. 12, 1989, vol. 337, No. 6203, pp. 147-149.
H. Masuda, Solid State Physics, 1996, vol. 31, No. 5, pp. 493-499.

\* cited by examiner

*Primary Examiner*—Jerome Jackson, Jr.
(74) *Attorney, Agent, or Firm*—Fitzpatrick, Cella, Harper & Scinto

(57) ABSTRACT

The invention provides a nanostructure including nanowires having very small diameters and integrated at a high density, and capable of being applied to still further high-functional devices.

The invention provides a structure including a substrate or substrate having an underlayer, and a structure formed on the substrate or substrate having an underlayer, wherein the structure includes a columnar first part (part) and a second part (part) formed to surround the first part, and the second part comprises two or more types of materials capable of forming eutectic crystals, one type of the materials is a semiconductor material, and the height of the first part from the substrate is greater than the height of the second part from the substrate.

6 Claims, 8 Drawing Sheets

CATALYTIC SENSOR STRUCTURE

BACKGROUND OF THE INVENTION

1. Field of the Invention

The present invention relates to a nanostructure comprising nanowires vertical or almost vertical to a film face, and a method for production of the same, and particularly to a nanostructure comprising nanowires in which narrow wires having very small diameters are integrated at a high density, characterized in that the average diameter of the nanowires is 20 nm or less, and the length of the nanowire is 1 μm or less. The nanostructure can be used in a wide range as functional materials such as electronic devices and micro-devices, structural materials and the like. Particularly, it can be applied as quantum effect devices, light emitting devices, solar batteries, catalysts, electrochemical sensors, biosensors and the like.

2. Related Background Art

Thin films, narrow wires and dots of metals and semiconductors may exhibit specific electric, optical and chemical natures due to confinement of movement of electrons in a size smaller than a certain characteristic length. Particularly, since the carbon nanotube was discovered, not only semiconductor quantum dots and quantum narrow wires of Si, Germanium (Ge) and the like but also metal nanostructures of Ag, Cu and the like have received attention.

Nanowires and nanodots can be used in electrochemical sensors and catalyst materials by taking advantage of their specific structures and characteristic properties such as electric conductivities and heat conductivities. The catalytic activity depends on factors such as the metal particle size, the particle density, the particle form, the surface atomic arrangement and the electronic structure. Nanowires having a large surface area and a characteristic structure have the potential for becoming a catalyst having a high activity. In addition, the nanowire can be used as a high efficiency electrode by taking advantage of its large surface.

As a method for production of nanowires, a fabrication method using a carbon tube and silica as a mold on a film, and the like can be considered. However, in these methods, it is difficult to produce nanowires having very small diameters and integrated at a high density.

Other methods for fabrication of nanowires include methods using microprocessing techniques. The microprocessing techniques include, for example, semiconductor processing techniques including fine pattern drawing techniques such as electron beam exposure and X-ray exposure as well as photolithography. Fabrication of nanostructures by such semiconductor processing techniques is poor in yield and increases the equipment cost, and thus a method enabling nanostructures to be fabricated easily and with good reproducibility is desired.

In addition to the fabrication methods by semiconductor processing techniques, there is an attempt to realize a new nanostructure using as a base a naturally formed regular structure, i.e. a structure formed in a self-organizing manner. This method has, among other things, the following advantages: 1) there is a possibility that a fine and specific structure better than those by conventional methods can be fabricated depending on the microstructure used as a base; and 2) a nanostructure having a large area can be generally fabricated.

Examples of specific structures formed in a self-organizing manner include alumina (Al) anodic oxidation coatings (RC. Furneaux, W. R. Rigby, and A. P. Davidson, Nature, Vol. 337, p147, 1989). When an Al film formed on substrate or an Al plate is anodized in an acidic electrolyte, porous oxidation coatings (anodized alumina) are formed (see RC. Furneaux, W. R. Rigby, and A. P. Davidson, Nature, Vol. 337, p147, 1989).

The feature of the porous oxidation coatings is that it has a specific geometrical structure in which very small columnar pores (nanoholes) having diameters of several nm to several hundreds nm are arranged in parallel with the space of several tens nm to several hundreds nm (cell size). The columnar pore has a high aspect ratio and is relatively excellent in evenness of diameters of sections if the space between pores is several tens nm or greater. The diameter and space of the pore can be controlled to some extent by adjusting the type of acid and the voltage during anodic oxidation.

Methods for fabrication of a nanostructure having nanosize pores include anodization of Si in addition to the anodic oxidation alumina described above. The anodization of Si is a method of forming porous Si by anodizing crystal Si or polycrystal Si in an aqueous solution having hydrofluoric acid (HF) as a base (Masuda, Kotai-Butsuri (Solid State Physics), Vol. 31, p493, 1996).

The porous Si has on the surface or in the interior thereof an infinite number of micropores each having a size of 1 nm to several tens nm under specific fabrication conditions. If seen macroscopically, the micropore is almost vertical to the film face, but its shape and density significantly vary depending on the conditions of anodization.

Applications of anodic oxidation structures fabricated in a self-organizing manner are explained in detail by Masuda (see Masuda, Kotai-Butsuri (Solid State Physics), Vol. 31, p493, 1996). They include, for example, an application as coatings utilizing abrasion resistance and insulation resistance of anodic oxidation coatings, and an application of peeling away the coatings to form a filter. Moreover, they are tried for various applications including coloring, magnetic recording media, EL light emitting devices, electrochromic devices, optics, solar batteries and gas sensors by using techniques of filling metals, semiconductors and the like in nanoholes, and techniques of replicas of nanoholes.

From this point of view, the self-regulating or self-forming method, particularly the method of Al anodic oxidation or Si anodization is capable of fabricating the nanostructure easily and in a large area, and is most suitable as a method for forming nanoholes having very small pore diameters at a high density.

In view of this technical background, the inventors conducted studies over and over again, and consequently found a method capable of forming a nanoporous member in which the average diameter of pores is 20 nm or less, and a wall material separating the pores is composed of a semiconductor material (Si, Ge, Si and Ge). It was found that by filling this nanoporous member with various kinds of materials (metal/alloy/semiconductor) and selectively removing only the wall material using a difference in solubility between the fillers and the wall material, a nanostructure comprising nanowires having very small diameters and integrated at a high density could be formed.

The present invention was made with this conventional situation as a background, and provides a nanostructure comprising nanowires having very small diameters and integrated at a high density, and capable of being applied to high-functional devices.

SUMMARY OF THE INVENTION

According to an aspect of the present invention, there is provided a structure comprising:

a substrate or a substrate having an underlayer; and a structure formed on the substrate or the substrate having an underlayer, wherein the structure comprises a columnar first part and a second part formed to surround the first part, and the second part comprises two or more types of materials capable of forming eutectic crystal, one of the types of the materials is a semiconductor material, and the height of the first part from the substrate is greater than the height of the second part from the substrate.

The semiconductor material preferably comprises any of Si, Ge or Si and Ge.

The average diameter of the first part is preferably 20 nm or less.

The height of the first part from the substrate is preferably 1 µm or less.

The first part preferably comprises a metal or alloy.

The first part preferably comprises Pd or Pt.

According to another aspect of the present invention, there is provided a sensor using the above-mentioned structure.

According to a further aspect of the present invention, there is provided a method for production of a nanostructure comprising the steps of:

forming a structure comprising a columnar first part and a second part formed to surround the first part, the second part comprising two or more types of materials capable of forming eutectic crystal on a substrate or a substrate having an underlayer;

removing the first part to form holes;

filling a material comprising a metal or an alloy in the holes; and removing partly or entirely the second part.

An electroplating method or an electroless plating method is preferably used in the step of filling the material.

The step of removing partly or entirely the second part preferably comprises a step of etching with an alkaline aqueous solution.

The present invention can provide a nanostructure with nanowires integrated in which the pore diameter of the nanowire is 20 nm or less and the space between pores is 30 nm or less. The nanostructure of the present invention comprises nanowires made of metal and alloy and particularly, nanowires made of Pt, Pd and the like can be used for a wide range of applications such as catalysts, chemical sensors and electrode materials.

BRIEF DESCRIPTION OF THE DRAWINGS

FIG. 1A is a plan view, and FIG. 1B is a sectional view taken along 1B—1B line of FIG. 1A;

FIG. 4A is a plan view, and FIG. 4B is a sectional view taken along 4B—4B line of FIG. 4A.

FIG. 5A illustrates a deposition step 1 (deposition of underlayer), FIG. 5B illustrates a deposition step 2 (deposition of AlSi (or AlGe, AlSiGe)), FIG. 5C illustrates a porous member forming step, FIG. 5D illustrates a plating step, and FIGS. 5E and 5F illustrate etching steps.

FIG. 10A illustrates a deposition step 1 (deposition of underlayer), FIG. 10B illustrates a deposition step 2 (deposition of AlSi or AlGe), FIG. 10C illustrates a porous member forming step, and FIG. 10D illustrates a plating step.

DESCRIPTION OF THE PREFERRED EMBODIMENTS

A nanostructure related to a best mode for carrying out the present invention will be described below with reference to the drawings.

Figure 1A:
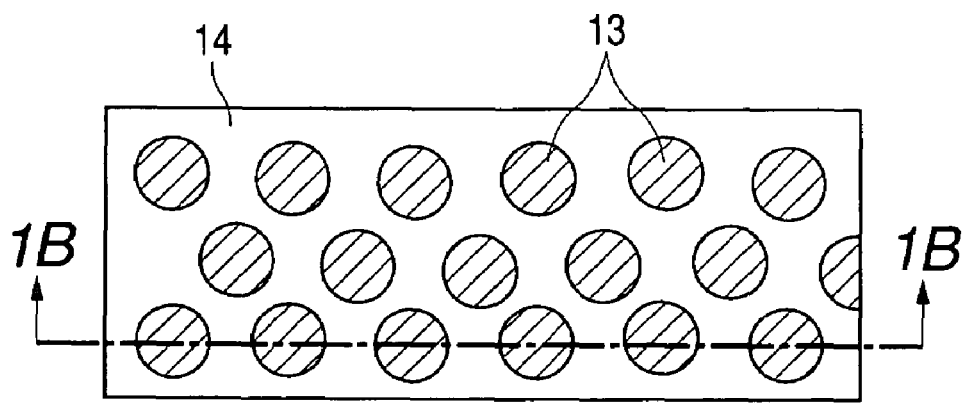
FIGS. 1A and 1B are schematic diagrams showing a nanostructure according to one embodiment of the present invention.
Figure 1B:
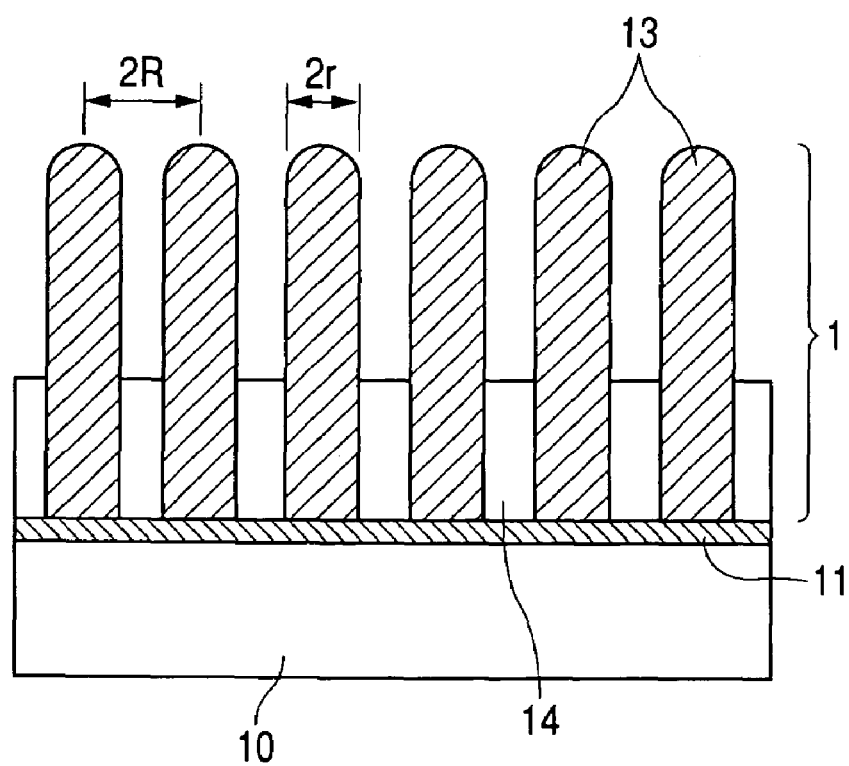

FIGS. 1A and 1B schematically show a nanostructure according to one embodiment of the present invention. In FIGS. 1A and 1B, reference numeral 10 denotes a substrate, reference numeral 11 denotes an underlayer, reference numeral 13 denotes nanowires, and reference numeral 14 denotes a matrix part formed by any of Si, Ge and SiGe.

The nanostructure 1 shown in FIGS. 1A and 1B is formed on the substrate 10 or on the underlayer 11 deposited on the substrate 10, the nanostructure 1 is formed such that aluminum columnar parts removed from a structure (described later) including the aluminum columnar parts having very small diameters and integrated at a high density and the matrix part 14 forming side walls thereof and surrounding each of them to prepare a nanoporous member (described later) uniform in pore diameter and pore density, predetermined material are filled in the pores with the nanoporous member as a mold to form nanowires 13 having very small diameters and integrated at a high density, and part of the matrix part 14 is dissolved and selectively removed to expose the nanowires 13 from the surface of the matrix part 14 in a raised form. That is, the matrix part 14 corresponds to the mold during formation of the nanowires 13. For the nanowires 13, materials such as any metal and alloy can be filled in the matrix part 14 by a plating method.

The underlayer 11 is deposited on the substrate 10 using any one of thin film formation methods including vapor phase methods using physical methods (PVD) such as the vapor deposition method/sputtering method, chemical methods (CVD) and the like, liquid phase methods such as plating, and solid phase methods such as the sol-gel method, but the surface of the underlayer 11 is preferably flat. The material of the underlayer 11 has as a main component a metal/alloy capable of being coated easily on by, for example, the magnetron sputtering method described later, which is used in this embodiment.

If electroplating is used for fabrication of nanowires 13, this underlayer 11 serves as an electrode, but whether it is conductive or not is not important if the substrate 10 has sufficient conductivity. If electroless plating is used for fabrication of nanowires 13, the underlayer 11 is required to have a catalytic activity.

If electroplating is used for fabrication of nanowires 13 in the present invention, the thickness of the underlayer 11 is set with the following considerations depending on the intended use. That is, if the substrate has conductivity, a conductive film placed on the substrate should only have a thickness large enough to sufficiently cover the substrate, and it may be preferably set to 10 nm to 100 μm. If the conductivity of the substrate is not sufficient, the underlayer 11 having conductivity has a thickness preferably in the range of approximately 10 nm to 100 μm, further preferably 50 nm to 1 μm although the thickness cannot be unconditionally determined because it is set according to the conductance p, area and the like of the underlayer conductive material. If electroless plating is used for fabrication of nanowires 13, a precious metal having as a main component Pt, Pd, Ru, Rh, Ir or the like having a catalytic activity is suitable as the underlayer 11. Because electroless plating does not depend on the conductivity of the underlayer 11, the underlayer 11 should only have a thickness large enough to sufficiently cover the substrate, and the thickness may be preferably set to 10 nm to 100 μm.

The matrix part 14 is a mold for formation of nanowires 13 as described previously, and constitutes a nanoporous member defining the size of the nanowires 13. For the nanoporous member, the average pore diameter (2r) is 20 nm or less, the average space (2R) between pores is 30 nm, and pores are columnar, mutually independent, and vertical or almost vertical to the film face.

The nanoporous member constituted by the matrix part 14 will be described below with reference to FIGS. 2 and 3.

Figure 2:
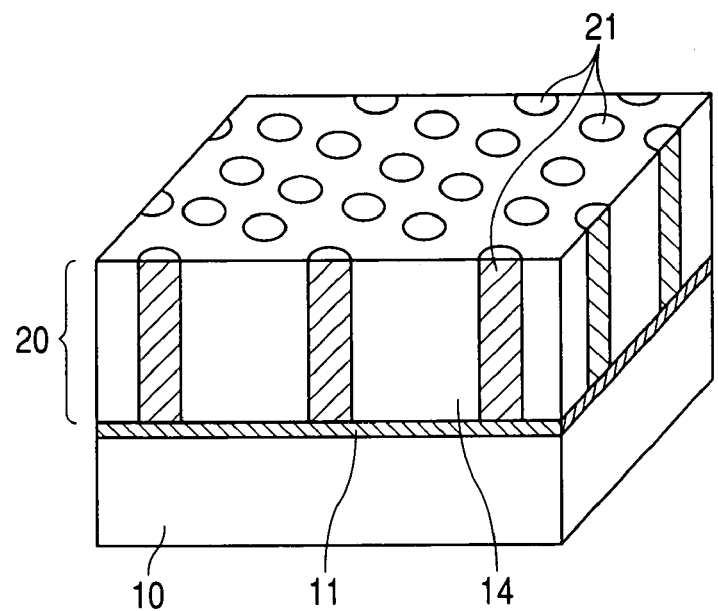
FIG. 2 is a schematic diagram of a structure having Al and Si (or Ge, SiGe) as main components.

FIG. 2 schematically shows a structure as a base of the nanoporous member. The structure 20 has Al as a first material, and has as a second material at least one type of element of Si and Ge as a main component, wherein columnar members comprising the first material, i.e. aluminum columnar parts 21 are surrounded by an area containing the second material, i.e. the matrix part 14 formed by Si (Ge or SiGe). The structure 20 is formed on the substrate 10 or underlayer 11.

The structure 20 contains the second material in a ratio of 20 atom % to 70 atom % based on the total amount of the first material and the second material. This ratio represents a ratio of the amount of the second material to the total amount of the first material and the second material constituting the structure 20, and is preferably 25 atom % to 65 atom %, more preferably 30 atom % to 60 atom %. The above ratio can be obtained by quantitative determination by, for example, inductively-coupled plasma emission spectrometry. The atom % is used as a unit but if wt % is used as a unit, the range of 20 atom % to 70 atom % is equivalent to a range of 20.65 wt % to 70.84 wt % (the unit conversion is made based on the assumption that the atomic weight of Al is 26.982 and the atomic weight of Si is 28.086).

The structure 20 should only have substantially a columnar shape and for example, the second material may be contained in the aluminum columnar part 21, or the first material may be contained in the area surrounding the aluminum columnar part 21, i.e. the matrix part 14. Elements such as O, Ar, N and H may be contained in the aluminum columnar part 21 and the matrix part 14.

It is desirable that the matrix part 14 having as a main component at least one element of Si and Ge being the second material should be amorphous. Preferably, the first and second materials are materials having a eutectic point in component system phase equilibrium diagrams of both materials (so called eutectic materials). Particularly, the eutectic point should be 300° C. or greater, preferably 400° C. or greater.

The size (diameter if the plane shape is circular) of the aluminum columnar part 21 can be controlled according mainly to the composition of the structure 20 (i.e. ratio of second material), but the average size thereof is 20 nm or less, preferably 1 nm to 15 nm. The average size herein is 2r in FIGS. 1A and 1B. For example, the average size 2r is a value derived directly from a photograph of a columnar part observed with an actual SEM photograph, or by image processing of the photograph by a computer.

The distance 2R between centers of members forming a plurality of aluminum columnar parts 21 (see FIGS. 1A and 1B) is 30 nm or less, preferably 5 nm to 20 nm. Of course, as the lower limit of the center-to-center distance 2R, the 2R should have at least a space where the columnar members do not mutually contact.

The structure 20 is preferably a film structure and in this case, the aluminum columnar parts 21 are dispersed in the member containing the second material in such a manner that they are almost vertical to the in-plane direction of the film. The thickness of the film structure is not specifically limited, but is preferably about 1 nm to 1 μm.

The structure 20 can be fabricated using a method of deposition in a non-equilibrium state. For the deposition method in the present invention, the sputtering method is preferable, but any deposition method of forming a material in a non-equilibrium state including resistance heating vapor deposition, the electron beam vapor deposition (EB vapor deposition), and ion plating can be applied. If the sputtering method is used, magnetron sputtering, RF sputtering, ECR sputtering or DC sputtering may be used but in this embodiment, the magnetron sputtering method is used.

Figure 3:
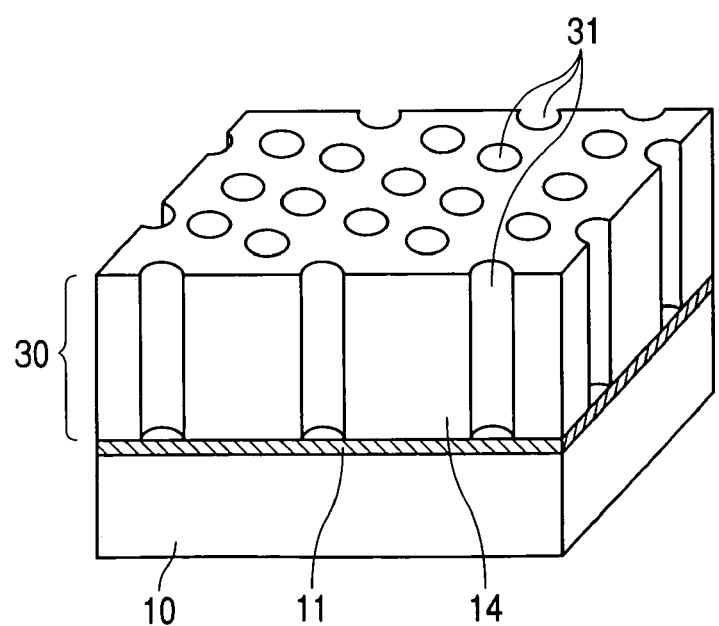
FIG. 3 is a schematic diagram of a nanoporous member having Si (or Ge, SiGe) as a main component.

FIG. 3 is a schematic diagram of a nanoporous member formed by selectively removing aluminum columnar parts from the above structure.

A nanoporous member 30 shown in FIG. 3 has a plurality of columnar pores (nanopores or nanoholes) 31 formed in the matrix part 14 by removing aluminum columnar parts from the structure. Etching for removing aluminum columnar parts from the structure is only required to be capable of selectively removing aluminum columnar parts and as an etching solution, for example, acids such as phosphoric acid, sulfuric acid, hydrochloric acid and nitric acid are suitable. Preferably, pores 31 of the nanoporous member 30 formed by removing aluminum columnar parts from the structure in this way are not mutually linked but are independent of one another. Various functional devices and apparatuses can be provided by filling various kinds of materials in the pores 31.

Another embodiment of the nanostructure according to the present invention will now be described.

Figure 4A:
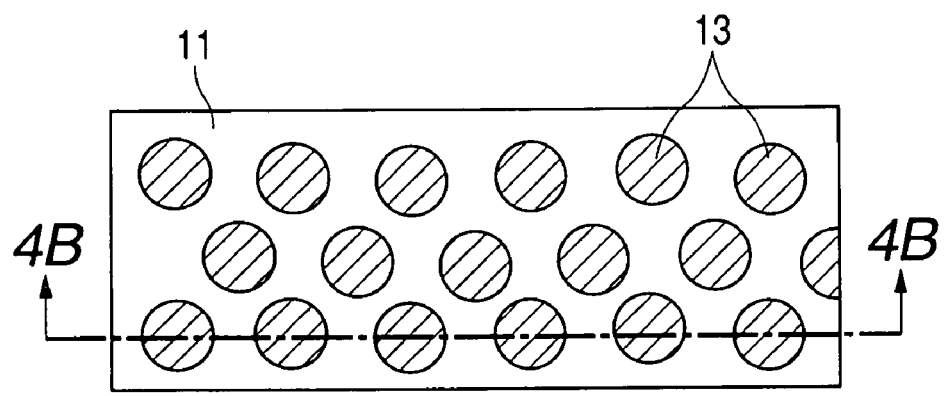
FIGS. 4A and 4B are schematic diagrams showing a nanostructure in another embodiment of the present invention.
Figure 4B:
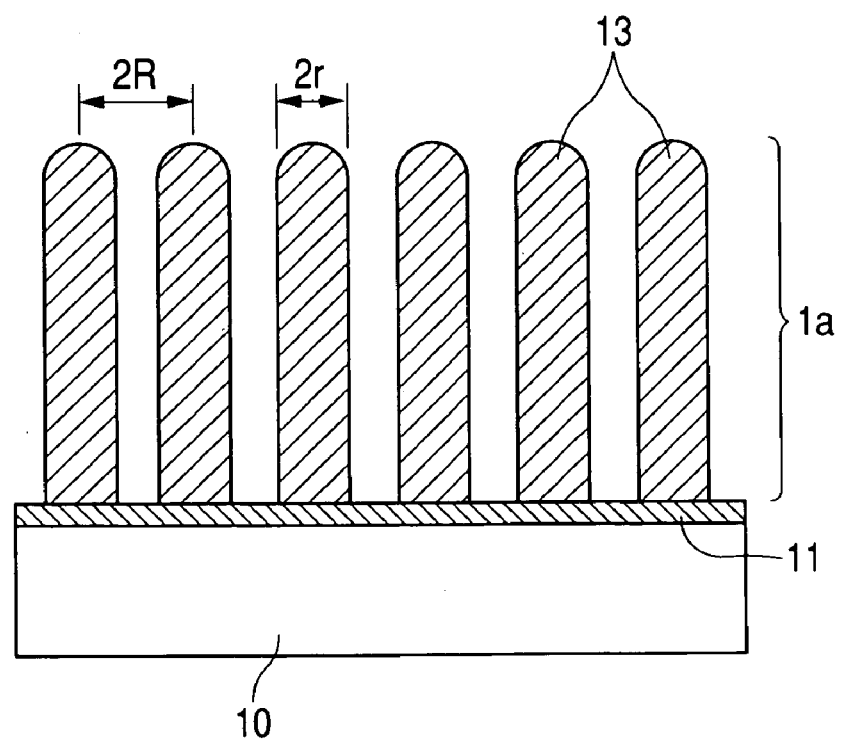

FIGS. 4A and 4B schematically show a nanostructure of another embodiment. In FIGS. 4A and 4B, reference numeral 10 denotes a substrate, reference numeral 11 denotes an underlayer, and reference numeral 13 denotes nanowires.

The nanostructure 1a shown in FIGS. 4A and 4B is characterized in that a nanoporous member used as a mold is all removed, and it is same as the nanostructure 1 shown in FIGS. 1A and 1B except that the matrix part 14 surrounding the side walls of nanowires 13 is present or absent.

According to the nanostructure 1a, the underlayer 11 of the nanowires 13 appears on the surface, whereby a composite functional material can be fabricated taking advantage of physical and chemical characteristics of the underlayer. Particularly, if the nanostructure 1a shown in FIGS. 4A and 4B is used as a catalyst, there is a possibility that the nanostructure 1a can be used as a composite functional catalyst by using a material having a catalytic activity different from that of the nanowire part, for the underlayer.

If the nanowires 13 of the nanostructure 1a in this embodiment are used as a catalysis material, a material having a high activity for an intended catalytic reaction, and a material allowing selective progression of the intended catalytic reaction should be selected. In the catalytic reaction, a material having an appropriate adsorption force for reactive gases is absolutely necessary and in this sense, precious metals capable of adsorbing relatively simple gas molecules such as $H_2$, $O_2$, $N_2$, CO, $CO_2$ and $NH_3$ can be materials suitable as catalysts. The same holds true when nanowires are used as a chemical sensor.

A method for production of the nanostructure in the present invention will now be described in detail with reference to FIGS. 5 to 8.

Production steps for use in the production method will be described below separately as (1) deposition step 1 (deposition of underlayer), (2) deposition step 2 (deposition of AlSi (or AlGe, AlSiGe)), (3) porous member forming step, (4) plating step and (5) etching step.

In the plating step (4) of this embodiment, the production step and important points in the production step are slightly different for the case of use of electroplating and the case of use of electroless plating. The plating step will be described below separately for the "I. Case of electroplating" and the "II. Case of electroless plating". In one example of the embodiment described below, AlSi is used as a material for use in the deposition step 2 (deposition of AlSi (or AlGe, AlSiGe)), but this step is not influenced even if part or all of Si is replaced with germanium and in this embodiment, AlSi is used for convenience of explanation.

I. Case of Use of Electroplating

Figure 5A:
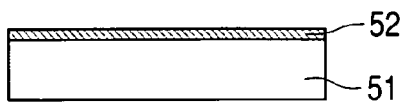
FIGS. 5A, 5B, 5C, 5D, 5E and 5F consist of a flow chart showing one example of a method for production of a nanostructure in the present invention.
Figure 5B:
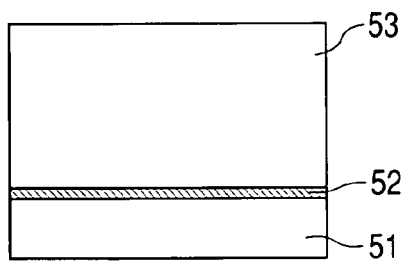
Figure 5C:
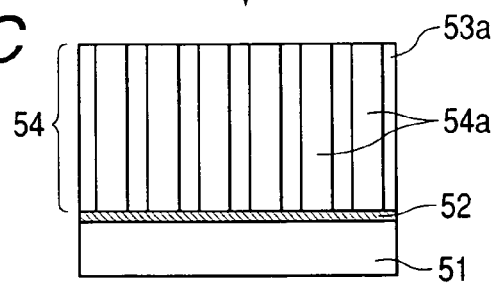
Figure 5D:
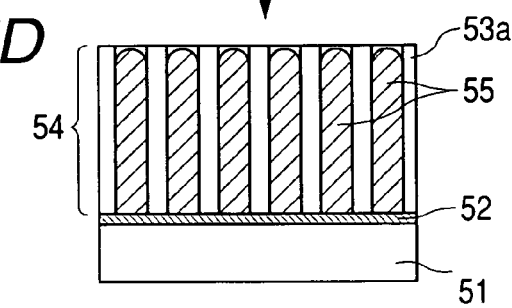
Figure 5E:
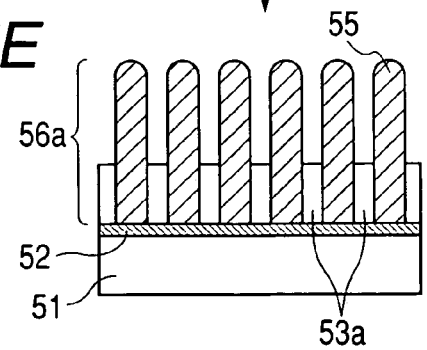
Figure 5F:
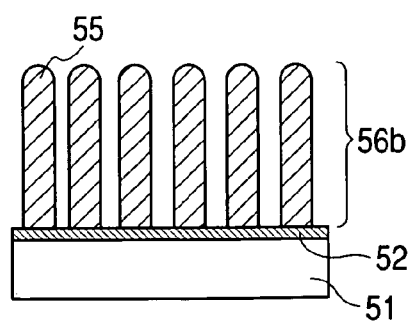

FIGS. 5A, 5B, SC, 5D, 5E and 5F are a flow chart of one embodiment concerning a method for production of the nanostructure in the present invention. FIG. 5A shows the deposition step 1 (deposition of underlayer), FIG. 5B shows the deposition step 2 (deposition of AlSi (or AlGe, AlSiGe), FIG. 5C shows the porous member forming step, FIG. 5D shows the plating step, and FIGS. 5E and 5F shows the etching step. The steps shown in FIGS. 5A to 5F are identical to steps that are used in Example 1 described later. Each step will be described in detail below.

Step (1): Deposition Step (1) (Deposition of underlayer)

In this step, an underlayer (Pd thin film) 52 is deposited on a substrate (Si substrate) 51 as shown in FIG. 5A.

The underlayer 52 serves as an electrode in electroplating for use in the plating step (4) described below. Therefore, it is preferably a thin film having conductivity, but whether it has conductivity or not is not important if the substrate 51 has sufficient conductivity. In the present invention, tungsten (W) is prepared as the underlayer 52 but of course, other material may be used without problems.

Substrates 51 include insulator substrates such as quarts glass and plastics, semiconductor substrates such as Si, Ga and As, metal substrates, and those having one or more films formed on these substrates. The material, thickness and mechanical strength of the substrate 51 are not specifically limited as long as the following steps that will be carried out subsequently are not adversely affected.

For deposition of the underlayer 52, any thin film formation method such as a vapor phase method using a physical method (PVD) such as the vapor deposition or sputtering method, or a chemical method CVD, a liquid phase method such as plating, or a solid phase method such as sol-gel can be applied but in this embodiment, the sputtering method capable of easily forming a thin film having a good thickness distribution is used.

There is no harm even if some of Ar being a working gas and H, O, Ar, N, C and the like being impurities in a vacuum apparatus exist in addition to the target material in the underlayer 52 deposited using the sputtering method.

Step (2): Deposition Step 2 (Deposition of AlSi (or AlGe, AlSiGe)

(a) Step of Preparing Al and Si

Figure 6:
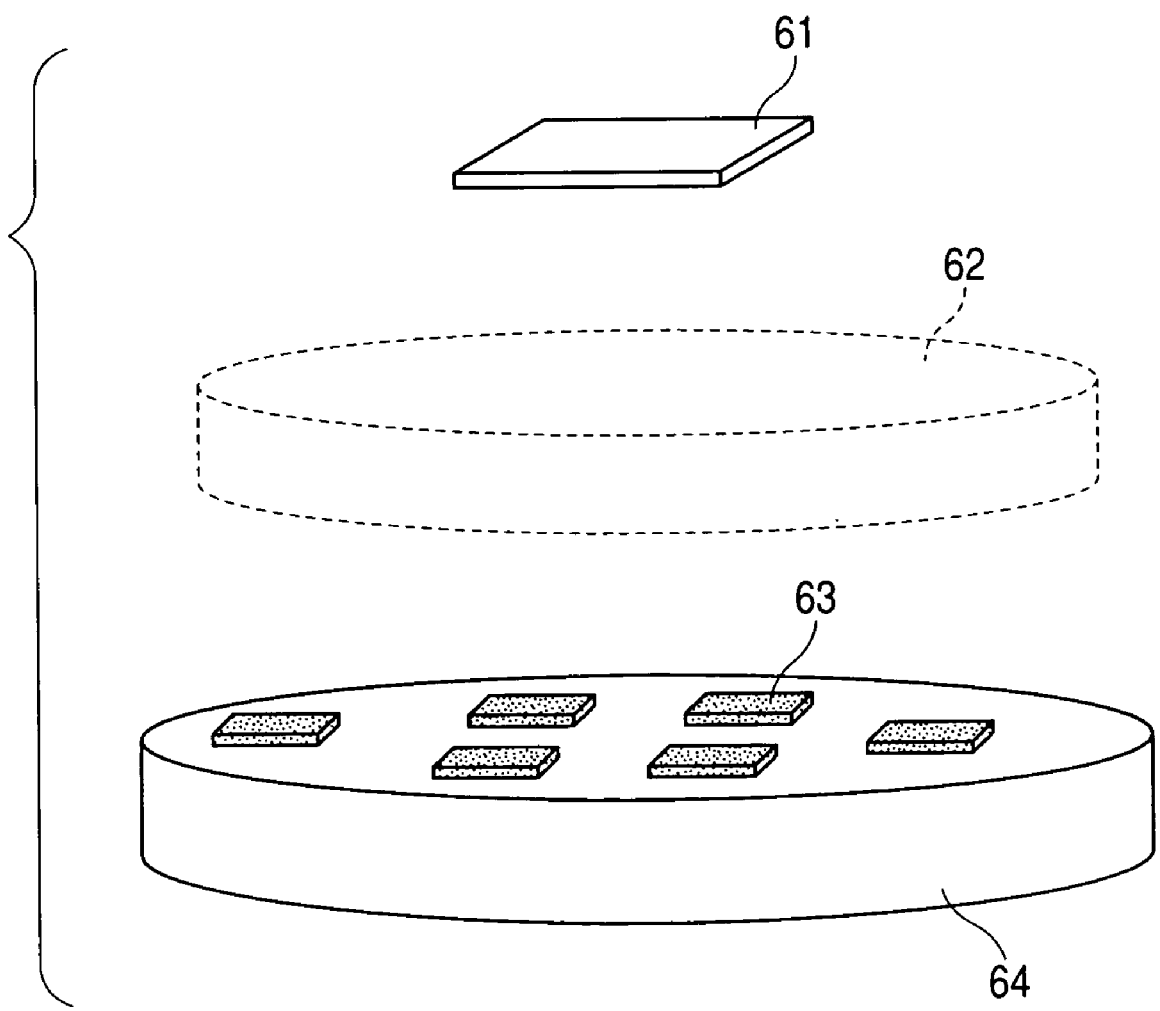
FIG. 6 is a schematic diagram illustrating a step of forming an Al Si structure for use in the present invention.

FIG. 6 shows the outline of the interior of a reactor using the magnetron sputtering method as a deposition method for forming a material in a non-equilibrium state. In FIG. 6, reference numeral 61 denotes a substrate, reference numeral 62 denotes Ar plasma, reference numeral 63 denotes Si chips, and reference numeral 64 is an Al target.

First, as a step of preparing Si and Al as raw materials, Si chips 63 are placed on the Al target (substrate) 64 in the reactor as shown in FIG. 6, for example.

(b) Step of Forming AlSi Structure

Then, using the magnetron sputtering method as a deposition method for forming a material in a non-equilibrium state, high-density Ar plasma 62 by Ar gas introduced as a discharge gas is generated on the Al target 64 in the reactor as shown in FIG. 6, Ar ions in the plasma 62 are made to impinge against the Al target 64 having Si chips 63 placed thereon to drive out Si and Al with the impact of the ions, and an AlSi structure composed of a mixture of Si and Al is formed on the substrate 41. The AlSi structure is constituted by columnar members (aluminum columnar parts) having Al as a main component and a member (matrix part) having Si as a main component, which surrounds the periphery thereof.

Si and Al as raw materials are achieved by placing of Si chips 63 on the Al target substrate 64 as shown in FIG. 6. The Si chip 63 is placed as a plurality of Si chips in FIG. 6, but it is not limited to this configuration, but only one Si chip may be used as long as desired deposition can be performed. However, for uniformly dispersing columnar members containing homogenous Al in a Si area, Si chips 63 should be symmetrically placed on the Al target 64. The ratio between Al and Si can be easily changed by control of the amount and layout of Si chips 63 with respect to the Al target 64.

A method may be used in which an AlSi sintered target fabricated by sintering a predetermined amount of powder of Al and Si is used, an Al target and a Si target are separately prepared, and both the targets are sputtered at a time.

The amount of Si in the formed film is 20 to 70 atom %, preferably 25 to 65 atom %, further preferably 30 to 60 atom % based on the total amount of Al and Si. If the amount of Si is in such a range, an AlSi structure having Al columnar members dispersed in the Si area can be obtained.

The temperature of the substrate is 300° C., preferably 200° C. or lower.

If the AlSi structure is formed by this method, Al and Si form a eutectic structure in a metastable state, and Al forms nanostructures (columnar members) of several nm in the Si matrix, and is separated in a self-organizing manner. Al at this time has almost a columnar shape, its pore diameter is 1 to 20 nm, and the space is 5 to 30 nm.

If deposition is carried out in a non-equilibrium state, the pressure in the reactor when Ar gas is flowed is preferably about 0.2 to 1 Pa especially in the case of the sputtering method. The output for generation of plasma is preferably about 150 to 1000 W in the case of a 4 inch target. However, the pressure and the output are not specifically limited thereto, and any pressure and output allowing Ar plasma 62 to be generated stably may be selected.

The deposition method for forming a material in a non-equilibrium state is preferably the sputtering method, but any deposition method for forming a material in a non-equilibrium state, including the resistance heating vapor deposition and electron beam vapor deposition (EB vapor deposition) can be applied.

For the method of deposition, the simultaneous deposition process of depositing Si and Al at a time may be used, or the multilayer deposition process of several atomic layers of Si and Al, respectively, may be used.

The AlSi structure formed as described above has Al-containing columnar members (aluminum columnar parts) comprised of a composition having Al as a main component, and a member (matrix part) having Si as a main component, which surrounds the columnar members.

The composition of the columnar member containing Al has Al as a main component, but may contain other elements such as Si, H, O, Ar and N as long as columnar microstructures are obtained.

The composition of the member having Si as a main component, which surrounds the column members having Al as a main component may contain various kinds of elements such as Al, O, Ar, N and H as long as columnar microstructures are obtained.

Through this step, an AlSi structure thin film (structure) 53 is formed (deposited) on the underlayer 52 formed on the substrate 51 by deposition as shown in FIG. 5B.

Step (3): Porous Member Forming Step

In this step, only columnar members (aluminum columnar parts) having Al as a main component in the AlSi structure are selectively etched as shown in FIG. 5C. As a result, in the AlSi structure, only a Si area having pores 54$a$, i.e. a matrix part 53$a$ is left, and a nanoporous member 54 is formed. The pore diameter 2r in the nanoporous member 54 is 20 nm or less, and the pore space 2R is 30 nm or less but preferably, the pore diameter 2r is 1 to 15 nm, and the pore space 2R is 5 to 20 nm. The length L is 1 nm to 1 µm.

Solutions for use in etching used in this step include, for example, acids such as phosphoric acid, sulfuric acid, hydrochloric acid and chromic acid, which dissolve Al and hardly dissolve Si, but the solution is not limited to a specific type of acid. A mixture of several acid solutions may be used. Etching conditions, for example, the temperature of the solution, the concentration and time may be selected as appropriate according to the Si porous member to be fabricated.

Step (4): Plating Step (Electroplating)

Figure 7:
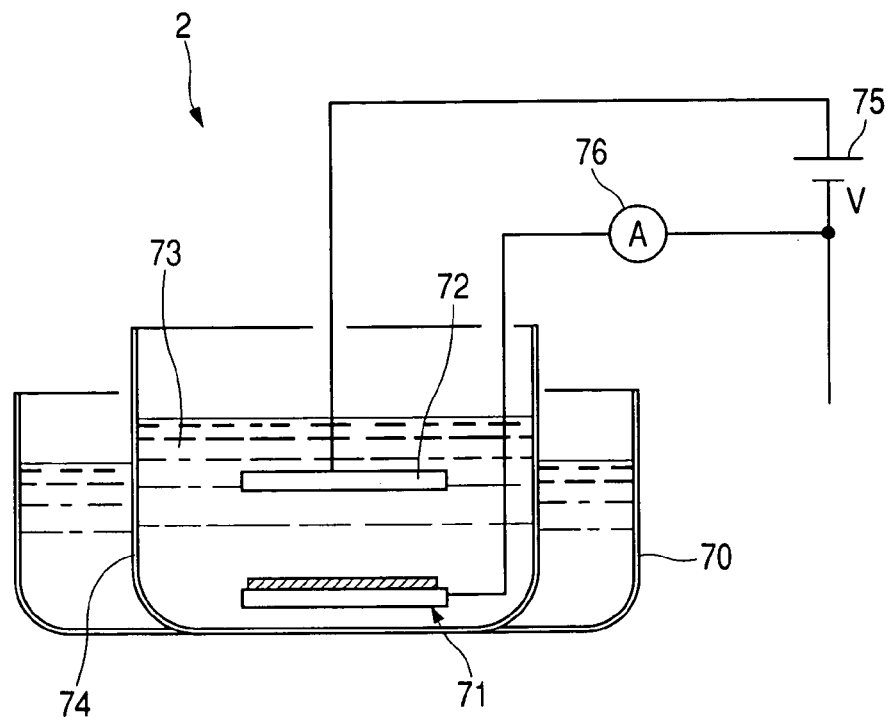
FIG. 7 is a schematic diagram of an electroplating apparatus for use in the present invention.

The outline of an electroplating apparatus for use in this step is shown in FIG. 7. In FIG. 7, reference numeral 2 denotes an electroplating apparatus, reference numeral 70 denotes a thermostat bath, reference numeral 71 denotes a sample, reference numeral 73 denotes an electrolyte, reference numeral 74 denotes a reaction vessel in which the electrolyte 73 is contained, reference numeral 72 denotes a counter electrode (anode), reference numeral 75 denotes a power supply applying a voltage to between the sample 71 and the counter electrode 72, and reference numeral 76 denotes an ampere meter measuring a current. Although not shown in FIG. 7, a computer automatically controlling and measuring a voltage and a current is also incorporated.

In the electroplating apparatus 2 shown in FIG. 7, the sample 71 and the counter electrode 72 are placed in the electrolyte 73 in the reaction vessel 74 kept at a constant temperature by the thermostat bath 70, and a voltage is applied to between the sample 71 and the counter electrode 72 by the power supply 75 to perform electroplating.

By this electroplating, a plating material is filled in the nanoporous member 54 fabricated in the porous member forming step (3) shown in FIG. 5C. By this electroplating, metals, alloys and the like can be filled. Consequently, nanowires (Pt nanowires) 55 are formed in a matrix part 53$b$ constituting the nanoporous member 54 as shown in FIG. 5D.

In the case of the present invention, Si being a porous member should be selectively dissolved by the following step (5): etching process to form a nanowire structure. Accordingly, as shown in the following step (5): etching process, a material to be filled should have a lower degree of solubility in an alkaline solution than the porous member of Si if an alkaline solution is used in etching. Therefore, precious metals such as Pt, Pd, Ru, Rh and Ir, and the like having a lower degree of solubility in an alkaline solution are preferable. For etching, Si can be selectively removed using hydrofluoric acid.

Step (5): Etching Step

By carrying out etching processing, part or all of the member having Si as a main component, which surrounds the nanowire material shown in FIGS. 5A to 5F, i.e. the matrix part 53$a$ is selectively removed to complete the nanowire structure of the present invention. The residue of the member having Si as a main component can be controlled by etching time, whereby part of the member having Si as a main component can be selectively removed to form a nanostructure 56$a$ having nanowires 55 raised upward with respect to the member having Si as a main component, which surrounds the nanowires 55 i.e. the matrix part 53$b$ (see nanostructure 1 of FIGS. 1A and 1B) as shown in FIG. 5E, or all of the member having Si as a main component, i.e. the matrix part 53$a$ can be selectively removed to form a nanostructure 56$b$ in which the member having Si as a main component, which surrounds nanowires 55, is all removed and thus no longer exists (see nanostructure 1$a$ of FIGS. 4A and 4B) as shown in FIG. 5F.

As an etching solution for use in this step, an alkaline solution such as NaOH or KOH is used. A desired nanowire material can be formed by control of the alkali concentration, processing time, and temperature. However, care should be taken on dissolution of the nanowire material.

II. Case of Use of Electroless Plating

Step (1): Deposition Step (Deposition of Underlayer)

For ensuring that electroless plating shown in the following step (4): plating step progresses, a thin film having a catalytic activity should be used as an underlayer. For the underlayer having a catalytic activity, Pd, Pt, Ru, Rh, Ir and the like are preferable. Not only a single metal but also an alloy film having two or more types of metals mixed may be used.

The underlayer should have a catalytic activity, but the underlayer may be poisoned with O, H, OH or other elements or the like to lose the catalytic activity. Particularly, in the present invention, extra care should be taken on diffusion occurring at the interface between the AlSi thin film being a porous member and the underlayer, oxidation of the underlayer due to the etching process of the porous forming step, and the like.

Regarding the catalytic activity of the underlayer, care should also be taken on surface degeneration of the underlayer and the like by influences of substances existing in an electroless plating bath used.

As a result of considering the catalytic activity of the underlayer, it was found that Pd and a Pd alloy have a high catalytic activity as an underlayer. However, the underlayer for electroless plating is not limited to Pd and a Pd alloy.

The underlayer placed on the substrate should only have a thickness large enough to sufficiently cover the substrate, and the thickness may be preferably set to 1 nm to 100 µm.

The catalyst for electroless plating to progress may be fine particles.

Deposition of the underlayer is carried out using any thin film formation method such as a vapor phase method using a physical method (PVD) such as the vapor deposition or sputtering method, a chemical method CVD or the like, a liquid phase method such as plating, a solid phase method such as sol-gel, or the like but in the present invention, the sputtering method is used.

There is no harm even if some of Ar being a working gas and hydrogen, oxygen, Ar, nitrogen, carbon and the like being impurities in a vacuum apparatus exist in addition to the target material in the underlayer deposited using the sputtering method as long as the catalytic activity is not deteriorated.

Step (2): Deposition Step 2 (Deposition of AlSi (or AlGe, AlSiGe)

This step is same as the step described in the "I. Case of use of electroplating" described previously.

Step (3): Porous Member Forming Step

This step can be carried out by a production method same as the method described in the "I. Case of use of electroplating" described previously, but a porous member forming step by another method will be described below.

In this step, only columnar members having Al as a main component in the AlSi structure are selectively etched to form a nanoporous member in the same manner as in the "I. Case of use of electroplating" described previously, and the structure and size of the obtained nanoporous member are same as those in the "I. Case of use of electroplating" described previously. That is, in the AlSi structure, only a Si area having pores is left to form a Si porous member. The pore diameter 2r in the Si porous member is 20 nm or less, and the pore space 2R is 30 nm or less but preferably, the pore diameter 2r is 1 to 15 nm, and the pore space 2R is 5 to 20 nm. The length L is 1 nm to 1 μm.

If the subsequent step (4): plating step is electroless plating, only columnar members having Al as a main component in the AlSi structure can be selectively etched taking advantage of the fact that the electroless plating solution is alkaline. If an electroless plating solution having a high pH concentration alkalinity with the alkali concentration of pH 10 to 12 is used, selective etching of the columnar members progresses due to the electroless plating solution, thus making it possible to form a nanoporous member having Si as a main component. Characteristically, electroless plating using the underlayer as a catalyst continuously progresses upon completion of etching.

Step (4): Plating Step (Electroless Plating)

Figure 8:
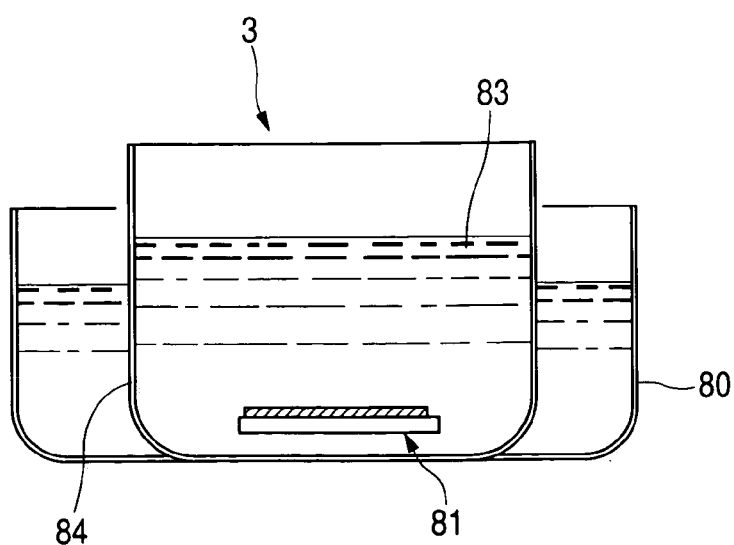
FIG. 8 is a schematic diagram of an electroless plating apparatus for use in the present invention.

The outline of an electroless plating apparatus for use in this step is shown in FIG. 8. In FIG. 8, reference numeral 3 denotes an electroless plating apparatus, reference numeral 80 denotes a thermostat bath, reference numeral 81 denotes a sample, reference numeral 83 denotes an electrolyte, and reference numeral 84 denotes a reaction vessel. The apparatus is a very convenient apparatus because the power supply and the like are not required unlike the electroplating apparatus described previously.

In the electroless plating apparatus 3 shown in FIG. 8, electroless plating is carried out by placing the sample 81 in the electroless plating liquid 83 in the reaction vessel 84 kept at a constant temperature by the thermostat bath 80. Consequently, a predetermined plating material is filled in the porous member fabricated in the step (3) shown in FIGS. 5A to 5F. Electroless plating continuously forms a film having a catalytic activity, i.e. it progresses in a self-organizing manner. Therefore, in the electroless plating, Au, Ag, Pt, Pd or the like being a material having a self-catalytic action can be plated.

In the case of electroless plating, Si being a porous member should be selectively etched in the subsequent step as in the case of the "case of use of electroplating". Accordingly, if etching with an alkaline aqueous solution is carried out, a material to be filled should have a lower degree of solubility in an alkaline solution than Si being a nanoporous member. Therefore, precious metals such as Pt, Pd, Ru, Rh and Ir, and the like having a lower degree of solubility in an alkaline solution are preferable.

Step (5): Etching Step

This step is same as the step described in the "case of use of electroplating" described previously.

The present invention will further described below using Examples.

EXAMPLE 1

FIGS. 5A, 5B, 5C, 5D, 5E and 5F are a flow chart showing one Example of a method for production of a nanostructure in the present invention as described previously. In this Example, one example of forming a nanostructure having Pt nanowires formed by the following steps (1) to (5) is shown.

(1) Deposition Step 1 (Deposition of Underlayer) (See FIG. 5A)

As shown in FIG. 5A, a Si substrate 51 was used as a substrate, a Pd thin film 52 with the thickness of 20 nm was formed on the Si substrate 51 by the magnetron sputtering method in this step. The Pd thin film 52 is a catalysts layer for the electroless plating step described below.

(2) Deposition Step 2 (Deposition of AlSi) (See FIG. 5B)

In this Example, an example of AlSi is shown, but the AlSi part may be replaced with AlGe or AlSiGe.

As shown in FIG. 5B, an AlSi structure thin film 53 with the thickness of 100 nm having AlSi as a main component was formed on the Pd thin film 52 with the thickness of 20 nm on the Si substrate 51, fabricated in the step (1) described above. The AlSi structure thin film 53 was observed by a FE-SEM (field emission scanning electron microscope) and as a result, it was found that columnar members containing circular cross section Al (aluminum columnar parts) surrounded by a Si area were two-dimensionally arranged. The diameter of pores forming the columnar members containing Al was 5 nm, and the average center-to-center distance thereof was 10 nm. The composition of the AlSi structure thin film was analyzed using inductively-coupled plasma emission spectrometry and as a result, it was found that the AlSi structure contained 40 atom % of Si based on the total amount of AlSi.

For deposition of the AlSi structure thin film 53, the magnetron sputtering method was used. In this magnetron sputtering method, a target prepared by placing eight Si chips each 15 mm square on a circular cross section Al target having a diameter of 4 inches (101.6 mm) was used. For sputtering conditions, a RF power supply was used, the flow rate of Ar was 50 sccm, the discharge pressure was 0.7 Pa, the input power was 1 kW, and the substrate was kept at room temperature (25° C.).

In addition, an AlSi structure containing 20 to 70 atom % of Si based on the total amount of AlSi can be fabricated by adjusting the ratio of Al/Si.

(3) Porous Member Forming Step (See FIG. 5C)

As shown in FIG. 5C, the thin film fabricated by the steps (1) and (2) described above was immersed in 0.3M phosphoric acid at 30° C. for 3 hours, and only Al columnar structure parts were selectively etched to form a nanoporous member 54 constituted by a matrix part 53a having pores 54a. The surface of the nanoporous member 54 was observed by a FE-SEM and as a result, it was found that pores 54a with the diameter of 5 nm and the space of 10 nm were formed in the matrix part 53a.

Further, the cross section structure was observed by the FE-SEM and as a result, it was found that columnar members containing Al (aluminum columnar parts) were fully dissolved, and nanoholes separated from one another by Si were mutually independently formed. Existence of coatings in the bottom of the pore 54a could not be recognized, and it can be considered that the Pd surface of the underlayer 52 is exposed. The nanoporous member 54 fabricated in this step was partly oxidized due to the etching step.

(4) Electroless Plating Step (See FIG. 5D)

As shown in FIG. 5D, electroless plating was used to form Pt nanowires 55 in the nanoporous member 54 with the Pd surface of the underlayer 52 exposed on the bottom of the pore 54, which had undergone the steps (1) to (3) described above.

The platinum electroless plating solution used here was a plating solution prepared by mixing together 1) 100 mL of Rectroless Pt 100 base solution (Nippon Electroplating Engineers Co., Ltd.), 2) 10 mL of 28% aqueous ammonia, 3) 2 mL of Rectroless Pt 100 reducing agent (Nippon Electroplating Engineers Co., Ltd.) and 4) 88 mL of pure water, and the nanoporous member 54 was immersed in the plating solution at 60° C. for 30 minutes to fill Pt in the pore 54.

An observation was made by the FE-SEM and as a result, it was found that platinum with the diameter of 5 nm and the height of 100 nm was filled in pores (nanoholes) surrounded by the matrix part 53a of the nanoporous member 54.

(5) Etching Step (See FIGS. 5E and 5F)

As shown in FIGS. 5E and 5F, the structure with Pt filled in nanoholes, which had undergone the steps (1) to (4) described above, was etched using 1M NaOH and as a result, the member having Si as a main component (matrix part 53a), which surrounded Pt, was selectively etched to form a nanostructure 56a or 56b having Pt nanowires 55.

In this step, the etching amount of the member having Si as a main component, which surrounds Pt, can be controlled by controlling the type of the etching solution, the temperature, the pH, the etching time, the stirring speed and the like, and the nanostructure 56a having Pt nanowires 55 as shown in FIGS. 1A and 1B described previously in which the member having Si as a main component (matrix part 53a), which surrounds Pt nanowires, is partly dissolved (see FIG. 5E), or the nanostructure 56b having Pt nanowires 55 as shown in FIGS. 4A and 4B described previously in which the member having Si as a main component (matrix part 53a), which surrounds Pt nanowires 55, is fully dissolved (see FIG. 5F) could be formed.

The nanostructure 56a or 56b having a desired size can be formed even if electroless plating of a metal other than Pt is carried out.

EXAMPLE 2

This Example shows one example of forming a nanostructure having Pt nanowires formed by the following steps (1) to (5).

(1) Deposition Step 1 (Deposition of Underlayer), (2) Deposition Step 2 (Deposition of AlSi)

These steps are same as the steps in Example 1 described above.

(3) Porous Member Forming Step Used by Electroless Plating Solution, (4) Step of Continuous Electroless Plating Steps The thin film fabricated in the steps (1) and (2) described above was immersed in a platinum electroless plating solution at 60° C. for 1 hour. The Pt electroless plating solution used here is a plating solution prepared by mixing together 1) 100 mL of Rectroless Pt 100 base solution, 2) 10 mL of 2.8% aqueous ammonia, 3) 2 mL of Rectroless Pt 100 reducing agent and 4) 88 mL of pure water, and the pH of the plating solution is 12.

This sample was observed by a FE-SEM and as a result, it was found that Pt with the diameter of 5 nm and the height of 100 nm was filled in a porous member. This indicates that columnar members having Al as a main component in the AlSi structure thin film was dissolved in the electroless plating solution of pH 12, resulting in formation of a porous member, and Pt was continuously filled in the porous member.

By controlling the time over which the thin film is immersed in the Pt electroless plating solution, the pH and temperature of the plating solution, and the stirring speed, steps of forming the nanoporous member from the AlSi structure thin film and filling Pt in the porous member can be continuously carried out.

(5) Etching Step

This step is same as the step in Example 1 described above.

Through these steps, a nanostructure having Pt nanowires as shown in FIGS. 1A and 1B in which the member having Si as a main component, which surrounds Pt nanowires, is partly dissolved, or a nanostructure having Pt nanowires as shown in FIGS. 4A and 4B in which the member having Si as a main component, which surrounds Pt nanowires, is fully dissolved, could be formed.

A nanostructure having a desired size can be formed even if electroless plating of a metal other than Pt is carried out.

EXAMPLE 3

This Example shows one example of forming a nanostructure having Pt nanowires formed by the following steps (1) to (5). This Example shows an example in which Pd fine particles are used as a catalyst layer as a method different from the method in which "the Pd thin film fabricated by the magnetron sputtering method is used as a catalyst layer for electroless plating" described in the paragraph (1) Step of depositing Underlayer in Example 1.

(1) Formation of Pd Fine Particles

A Si substrate was used as a substrate. Pd fine particles were formed on the Si substrate using a sensitive-active method that is generally known. First, the Si substrate was immersed in a $SnCl_2$ solution to adsorb $Sn^{2+}$ ions on the surface of the substrate. Then, The Si substrate was immersed in a $PdCl_2$ solution, whereby $Pd^{2+}$ ions were reduced according to the following reaction to deposit active catalyst nuclei on the surface of the substrate.

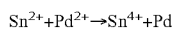

$$Sn^{2+}+Pd^{2+}\rightarrow Sn^{4+}+Pd$$

The following steps, i.e. (2) deposition step 2 (deposition of AlSi), (3) porous member forming step, (4) electroless plating step and (5) etching step are same as those of Example 1 described above.

Through these steps, a nanostructure having Pt nanowires as shown in FIGS. 1A and 1B in which the member having Si as a main component, which surrounds Pt nanowires, is partly dissolved, or a nanostructure having Pt nanowires as shown in FIGS. 4A and 4B in which the member having Si as a main component, which surrounds Pt nanowires, is fully dissolved, could be formed.

A nanostructure having a desired size can be formed even if electroless plating of a metal other than Pt is carried out.

EXAMPLE 4

This Example shows one example of a nanostructure having nanowires formed by the following steps (1) to (5).

(1) Deposition Step 1 (Deposition of Underlayer)

A Si substrate was used as a substrate. A W thin film with the thickness of 20 nm was formed on the Si substrate by the magnetron sputtering method. The W thin film is an electrode layer for the electroplating step described below.

(2) Deposition Step 2 (Deposition of AlSi)

An AlSi structure thin film with the thickness of 200 nm having AlSi as a main component was formed on the W 20 nm/Si substrate fabricated in the step (1) described above. The AlSi structure thin film formed here and the steps of forming the same are same as those shown in Example 1.

(3) Porous Member Forming Step

The thin film fabricated by the steps (1) and (2) described above was immersed in 0.3 M phosphoric acid at 30° C. for 3 hours, and only Al columnar structure parts were selectively etched to form a nanoporous member. The surface of this porous member was observed by a FE-SEM and as a result, it was found that pores with the diameter of 5 nm and the space of 10 nm were formed. Further, the cross section structure was observed by the FE-SEM and as a result, it was found that columnar member parts containing Al were fully dissolved, and nanoholes separated from one another by Si were mutually independently formed. Existence of coatings in the bottom of the pore could not be recognized, and it can be considered that the W surface of the underlayer is exposed.

(4) Electroplating Step

Co was filled in the nanoporous member with the W surface of the underlayer exposed on the bottom of the nanoholes, which had undergone the steps (1) to (3) described above, using the electroplating method. For the plating solution, an aqueous solution of 0.2 M of cobalt sulfate (II) heptahydrate and 0.3 M of boric acid was used at 24° C., and Ag/AgCl was used as a counter electrode to carry out electroplating at a voltage of −1.5 V. An observation was made by the FE-SEM, Co with the diameter of 5 nm and the height of 200 nm was filled in the porous member.

(5) Etching Step

As a result of using 1M NaOH to etch the structure with Co filled in nanoholes, which had undergone the steps (1) to (4) described above and as a result, a member having Si as a main component, which surrounded Co, was selectively etched to form a nanostructure having Co nanowires.

In this step, the etching amount of the member having Si as a main component, which surrounds Co, can be controlled by controlling the type of the etching solution, the temperature, the pH, the etching time, the stirring speed and the like, and a nanostructure having Co nanowires as shown in FIGS. 1A and 1B in which the member having Si as a main component, which surrounds Co nanowires, is partly dissolved, or a nanostructure having Co nanowires as shown in FIGS. 4A and 4B in which the member having Si as a main component, which surrounds Co nanowires, is fully dissolved could be formed.

A nanostructure having a desired size can be formed even if electroplating of a metal other than Co is carried out.

EXAMPLE 5

In this Example, a nanostructure having Pt nanowires was fabricated by the process described in Example 1. However, the pore diameter of the Pt nanowire is 5 nm, the average center-to-center space is 10 nm, and the length of the Pt nanowire is 50 nm. In the nanostructure, a member having Si as a main component, which surrounds Pt nanowires, is fully dissolved. Pt nanowires grow in a circle having a diameter of 1 cm.

The catalytic activity of the Pt nanowires shown in this Example was examined. As one example, a catalytic reaction for producing nitrogen monoxide from ammonia and oxygen was examined.

It can be considered that Pt nanowires contribute as a catalyst for a reaction for producing nitrogen monoxide from ammonia and oxygen, which is an elementary reaction for the nitric acid production process. It was ensured that as a result of introducing ammonia and oxygen in the mixing ratio of 4:1 into the nanostructure fabricated in this Example, nitrogen monoxide was produced. In the nitric acid production plant, platinum catalyst network knitted with platinum wires is used. Generally, the platinum catalyst network is fabricated through complicated steps, but the Pt nanowire shown in this Example can be fabricated inexpensively through a relatively easy process.

As still another example, an aquatic gas shift reaction in which carbon monoxide reacts with water to produce carbon dioxide and hydrogen was examined. When carbon monoxide and water were introduced into the Pt nanowire heated at 200° C., carbon dioxide and hydrogen were produced, and a large turn over number (parameter of catalytic activity) was shown. It indicated that the Pt nanowire had a high catalytic activity.

Pt is a material effective for hydrogenation reactions, dehydrogenation reactions, hydrocracking reactions, oxidation reactions and the like, and the Pt nanowire having a large surface area, shown in this Example, is an effective material as a catalyst material, and can be used as a chemical sensor using these reactions.

Preliminary experiments on a structure as a base of a nanoporous member for use in the present invention (see structure 20 of FIG. 2, and AlSi structure thin film 53 of FIG. 5B) will now be described. This structure contains Al as a first material, and contains as a second material a matrix part having at least one type of element of Si and Ge as a main component, but Si is used as the second material here.

Experiment 1: First Material Al, Second Material Si

Al narrow wires in which Al structure parts surrounded by Si are columnar, and the diameter 2r thereof is 3 nm, the space 2R is 7 nm, and the length L is 200 nm (see aluminum columnar parts 21 of FIG. 2) will be described.

First, a method for fabrication of Al narrow wires will be described.

Using the RF magnetron sputtering method, an AlSi mixture film containing 55 atom % of Si based on the total amount of Al and Si is formed in the thickness of about 200 nm on a glass substrate. For the target, a target prepared by placing eight Si chips 13 each 15 mm square on a 4 inch Al target was used. For sputtering conditions, a RF power supply was used, the flow rate of Ar was 50 sccm, the discharge pressure was 0.7 Pa, and the input power was 1 kW. The substrate was kept at room temperature.

A target prepared by placing eight Si chips on an Al target was used as a target in this case, but the number of Si chips is not limited to 8, and varies depending on the sputtering conditions, and any number of Si chips may be placed as long as the AlSi mixture film contains about 55 atom % of Si. The target is not limited to a target having Si chips placed on an Al target, but Al chips may be placed on a Si target, and a target prepared by sintering Si and Al powders.

Then, the AlSi mixture film obtained in this way was analyzed by ICP (inductively-coupled plasma emission spectrometry) to determine the ratio (atom %) of the amount of Si to the total amount of Al and Si. As a result, the ratio of the amount of Si to the total amount of Al and Si was about 55 atom %. In this case, an AlSi mixture film deposited on a carbon substrate was used as a substrate for convenience of measurement.

The AlSi mixture film was observed by a FE-SEM. For the shape of the surface seen from right above the substrate, circular cross section Al nanostructures surrounded by Si were two-dimensionally arranged. The diameter of the Al nanostructure part was 3 nm, and the average center-to-center distance thereof was 7 nm. The cross section was observed by the FE-SEM and as a result, the height was 200 nm, and Al nanostructure parts were mutually independent.

The sample was observed by the X-ray diffraction method and as a result, the peak of Si indicating crystallinity was not present, which indicated that the Si was amorphous.

Thus, an AlSi nanostructure containing Al narrow wires with the space 2R of 7 nm, the diameter 2r of 3 nm and the height L of 200 nm surrounded by Si could be fabricated.

COMPARATIVE EXAMPLE

As a comparative sample A, an AlSi mixture film containing 15 atom % of Si based on the total amount of Al and Si is formed in the thickness of about 200 nm on a glass substrate using the sputtering method. For the target, a target prepared by placing 2 Si chips 13 each 15 mm square on a 4 inch Al target was used. For sputtering conditions, a RF power supply was used, the flow rate of Ar was 50 sccm, the discharge pressure was 0.7 Pa, and the input power was 1 kW. The substrate was kept at room temperature.

The comparative sample A was observed by a FE-SEM. For the shape of the surface seen from right above the substrate, the Al part did not have a circular shape but had a cabled shape. That is, this was not a microstructure having columnar structures of Al uniformly dispersed in a Si area. Further, the size of the structure was much larger than 10 nm. The cross section was observed by the FE-SEM and as a result, the width of the Al part was larger than 15 nm. The AlSi mixture film obtained in this way was analyzed by ICP (inductively-coupled plasma emission spectrometry) to determine the ratio (atom %) of the amount of Si to the total amount of Al and Si. As a result, the ratio of the amount of Si to the total amount of Al and Si was about 15 atom %.

As a comparative sample B, an AlSi mixture film containing 75 atom % of Si based on the total amount of Al and Si is formed in the thickness of about 200 nm on a glass substrate using the sputtering method. For the target, a target prepared by placing fourteen Si chips 13 each 15 mm square on a 4 inch Al target was used. For sputtering conditions, a RF power supply was used, the flow rate of Ar was 50 sccm, the discharge pressure was 0.7 Pa, and the input power was 1 kW. The substrate was kept at room temperature.

The comparative sample B was observed by a FE-SEM. No Al part could be observed on the sample surface seen from right above the substrate. The cross section was observed by the FE-SEM, but the Al part could not be clearly observed. The AlSi mixture film obtained in this way was analyzed by ICP (inductively-coupled plasma emission spectrometry) to determine the ratio (atom %) of the amount of Si to the total amount of Al and Si. As a result, the ratio of the amount of Si to the total amount of Al and Si was about 75 atom %.

Samples containing 20 atom %, 35 atom %, 50 atom %, 60 atom % and 70 atom % of Si, respectively, based on the total amount of AlSi mixture, were fabricated in the same manner as in fabrication of the comparative sample A except that the number Si chips was varied. The results are shown below, in which samples forming a microstructure having columnar structures of Al uniformly dispersed in a Si area are rated "F" and samples not forming such a microstructure are rated "N".

TABLE 1

| Ratio of silicon (atom %) | Microstructures |
|---|---|
| 15 (Comparative sample A) | N |
| 20 | F |
| 25 | F |
| 35 | F |
| 50 | F |
| 55 | F |
| 60 | F |
| 65 | F |
| 70 | F |
| 75 (Comparative sample B) | N |

In this way, by making an adjustment so that the content of Si is 20 atom % to 70 atom % based on the total amount of Al and Si, the pore diameter of the fabricated Al nanostructure can be controlled, and Al narrow wires excellent in linearity can be fabricated. For observation of the structure, a TEM (Transmission electron microscope) or the like should be used in addition to the SEM. For the content described above, the result was same when germanium or a mixture of Si and germanium was used instead of the Si.

Further, as a comparative sample C, an AlSi mixture film containing 55 atom % of Si based on the total amount of Al and Si is formed in the thickness of about 200 nm on a glass substrate using the sputtering method. For the target, a target prepared by placing eight Si chips 13 each 15 mm square on a 4 inch Al target was used. For sputtering conditions, a RF power supply was used, the flow rate of Ar was 50 sccm, the discharge pressure was 0.7 Pa, and the input power was 1 kW. The substrate was kept at a temperature of 250° C.

The comparative sample C was observed by a FE-SEM (field emission scanning electron microscope). A clear boundary between Al and Si could not be observed on the sample surface seen from right above the substrate. That is, an Al nanostructure could not be observed. That is, it can be thought that if the temperature of the substrate is too high, the structure is changed into a more stable state, and therefore film growth for forming such an Al nanostructure does not occur.

For obtaining a structure having columnar members dispersed, the composition of the target is preferably set to Al:Si=55:45.

As described above, the nanostructure of the present invention can be used in a wide range as functional materials such as electronic devices and micro-devices, structural materials and the like, and particularly it can be used for applications such as quantum effect devices, light emitting devices, solar batteries, catalysts, electrochemical sensors, biosensors and fuel cells.

The present invention will be further described below using Examples.

EXAMPLE 6

This Example describes, as one example, an example of fabricating a nanostructure 34 by etching a Si substrate 14 with a Pd underlayer 13 having an (Al, Si) mixture thin film 24 formed thereon, and then immersing the substrate 14 in a platinum electroless plating solution (see FIGS. 10A to 10D).

Figure 10A:
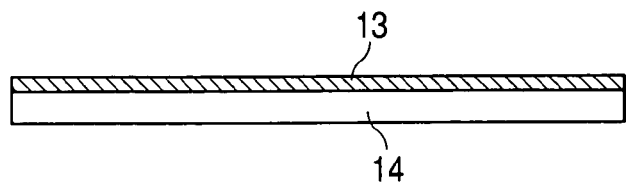
FIGS. 10A, 10B, 10C and 10D consist of a flow chart showing another example of a method for production of a nanostructure in the present invention.

First, as the underlayer 13 having a catalytic activity, a Pd thin film with the thickness of 20 nm was formed on the Si substrate 14 by the sputtering method (see FIG. 10A). Further, the (Al, Si) mixture thin film 24 with the thickness of 100 nm having the composition ratio of Al:Si of 3:2 was formed on the Si substrate 14 with the Pd underlayer 13 by the sputtering method (see FIG. 10B).

Figure 9A:
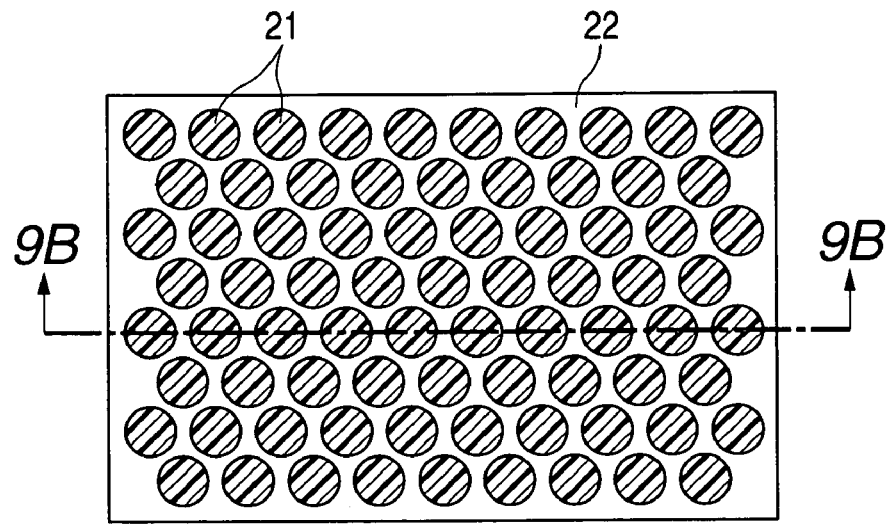
FIGS. 9A and 9B are a schematic plan view and a schematic sectional view of a base consisting of a structure on a substrate of the present invention.

The surface of the substrate was observed by a FE-SEM (field emission scanning electron microscope) and as a result, it was found that columnar members 21 with the diameter of about 5 nm and the center-to-center distance of about 10 nm having Al as a main component were formed in a large number in the surface of a matrix 22 having Si as a main component (see FIG. 9A). The cross section was observed and as a result it was found that columnar members 21 having Al as a main component were formed vertically to the Si substrate 23 with the underlayer 13 (see FIG. 9B). Hereinafter, a set of the structure on the substrate is referred to as a "base".

Then, the base was immersed in 5 wt % phosphoric acid set at 25° C. for 6 hours to etch the base. The cross section of this sample was observed by the FE-SEM and as a result, it was found that columnar members 21 having Al as a main component were fully dissolved to form pores 31 with the diameter of about 5 nm and the center-to-center distance of about 10 nm (see FIG. 10C).

Then, as a method for preparation of a platinum electroless plating solution, 100 mL of Rectroless Pt 100 base solution (Nippon Electroplating Engineers Co Ltd.), 10 mL of 28% aqueous ammonia, 2 mL of Rectroless Pt 100 reducing agent (Nippon Electroplating Engineers Co Ltd.) and 88 mL of pure water were mixed together to prepare a platinum electroless plating solution. The pH of the plating solution was 12.

Subsequently, the platinum electroless plating solution was heated and set at 60° C. In this state, the base was immersed in the plating solution for 30 minutes. This sample was observed by the FE-SEM and as a result, it was found that platinum columnar structures 33 were formed in pores 31 formed as a result of dissolution of columnar members 21 having Al as a main component in the base (see FIG. 10D). The platinum columnar structure 33 had a diameter of about 5 nm and a height of about 100 nm. The center-to-center distance was about 10 nm.

As described above, columnar members 21 having Al as a main component, of the (Al, Si) mixture thin film 24 formed by control of the composition ratio between Al and Si and the thickness is etched, and then immersed in the platinum electroless plating solution, whereby platinum columnar structures 33 can be formed in pores 31 formed by the etching. By selecting the type of etching solution, and controlling the etching time, the temperature of the etching solution, the stirring speed and the pH of the etching solution, the level of dissolution of columnar members 21 having Al as a main component can be controlled as desired.

EXAMPLE 7

This Example describes, as one example, an example of fabricating a nanostructure 34 by etching a Si substrate 14 with a Pd underlayer 13 having an (Al, Si) mixture thin film 24 formed thereon, and then immersing the substrate 14 in a palladium electroless plating solution (see FIGS. 10A to 10D).

First, as the underlayer 13 having a catalytic activity, a Pd thin film with the thickness of 20 nm was formed on the Si substrate 14 by the sputtering method (see FIG. 10A). Further, the (Al, Si) mixture thin film 24 with the thickness of 100 nm having the composition ratio of Al:Si of 3:2 was formed on the Si substrate 14 with the Pd underlayer 13 by the sputtering method (see FIG. 10B).

The surface of the substrate was observed by a FE-SEM and as a result, it was found that columnar members 21 with the diameter of about 5 nm and the center-to-center distance of about 10 nm having Al as a main component were formed in a large number in the surface of a matrix 22 having Si as a main component (see FIG. 9A). The cross section was observed and as a result it was found that columnar members 21 having Al as a main component were formed vertically to the Si substrate 23 with the underlayer 13 (see FIG. 9B). Hereinafter, a set of the structure on the substrate is referred to as a "base".

The base was immersed in 5 wt % phosphoric acid set at 25° C. for 6 hours to etch the base. The cross section of this sample was observed by the FE-SEM and as a result, it was found that columnar members 21 having Al as a main component were fully dissolved to form pores 31 with the diameter of about 5 nm and the center-to-center distance of about 10 nm (see FIG. 10C).

Then, as a method for preparation of a palladium electroless plating solution, 0.01 mol/l of palladium chloride, 0.08 mol/l of ethylene diamine, 0.02 mol/l of sodium phosphite and 30 mg/l of thiodiglycolic acid were mixed together to prepare a palladium electroless plating solution. The pH of the plating solution was 7. Subsequently, the palladium electroless plating solution was heated and set at 50° C. In this state, the base was immersed in the plating solution for 30 minutes.

Figure 10B:
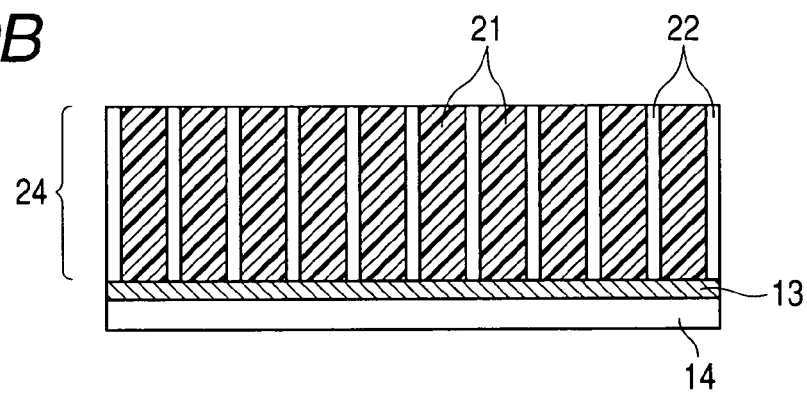
Figure 10C:
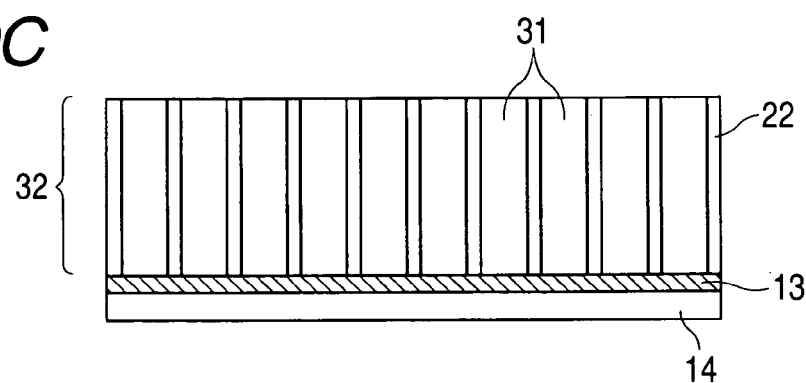
Figure 10D:
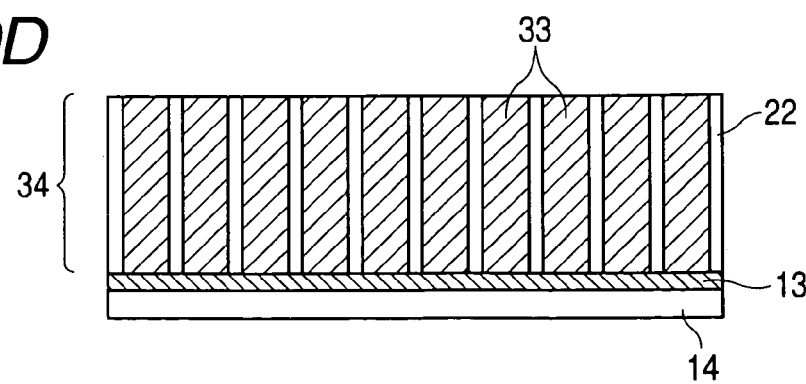

This sample was observed by the FE-SEM and as a result, it was found that PdP columnar structures 33 containing a small amount of P were formed in pores 31 formed as a result of dissolution of columnar members 21 having Al as a main component in the base (see FIG. 10D). The columnar structure 33 had a diameter of about 5 nm and a height of about 80 nm. The center-to-center distance was about 10 nm.

As described above, columnar members 21 having Al as a main component, of the (Al, Si) mixture thin film 24 formed by control of the composition ratio between Al and Si and the thickness is etched, and then immersed in the palladium electroless plating solution, whereby PdP columnar structures 33 can be formed in pores 31 formed by the etching. By selecting the type of etching solution, and controlling the etching time, the temperature of the etching solution, the stirring speed and the pH of the etching solution, the level of dissolution of columnar members 21 having Al as a main component can be controlled as desired.

EXAMPLE 8

This Example describes, as one example, an example of fabricating a nanostructure 34 by immersing in a platinum electroless plating solution a Si substrate 14 with a Pd underlayer 13 having an (Al, Si) mixture thin film 24 formed thereon (see FIGS. 10A to 10D).

First, as the underlayer 13 having a catalytic activity, a Pd thin film with the thickness of 20 nm was formed on the Si substrate 14 by the sputtering method (see FIG. 10A). Further, the (Al, Si) mixture thin film 24 with the thickness of 100 nm having the composition ratio of Al:Si of 3:2 was formed on the Si substrate 14 with the Pd underlayer 13 by the sputtering method (see FIG. 10B). Hereinafter, a set of the structure on the substrate is referred to as a "base".

The surface of the substrate was observed by a FE-SEM and as a result, it was found that columnar members 21 with the diameter of about 5 nm and the center-to-center distance of about 10 nm having Al as a main component were formed in a large number in the surface of a matrix 22 having Si as a main component (see FIG. 9A). The cross section was observed and as a result it was found that columnar members 21 having Al as a main component were formed vertically to the Si substrate 14 from the Pd underlayer 13 (see FIG. 9B).

Then, as a method for preparation of a platinum electroless plating solution, 100 mL of Rectroless Pt 100 base solution (Nippon Electroplating Engineers Co Ltd.), 10 mL of 28% aqueous ammonia, 2 mL of Rectroless Pt 100 reducing agent (Nippon Electroplating Engineers Co Ltd.) and 88 mL of pure water were mixed together to prepare a platinum electroless plating solution. The pH of the plating solution was 12.

Subsequently, the platinum electroless plating solution was heated and set at 60° C. In this state, the base was immersed in the plating solution for 1 hour. This sample was observed by the FE-SEM and as a result, it was found that platinum columnar structures 33 were formed in pores 31 formed as a result of dissolution of a cicular member parts 21 having Al as a main component in the base. The platinum columnar structure 33 had a diameter of about 5 nm and a height of about 100 nm. The center-to-center distance was about 10 nm (see FIG. 10D).

As described above, by controlling the time of immersion in the platinum electroless plating solution, the pH of the plating solution, the temperature of the plating solution and the stirring speed in accordance with the thickness of the (Al, Si) mixture thin film 24 formed by control of the composition ratio between Al and Si and the thickness, the platinum columnar structure 33 having a desired size can be formed. The nanostructure 34 having a desired size can be formed even if electroless plating of a metal other than platinum is carried out.

EXAMPLE 9

This Example describes, as one example, an example of fabricating a nanostructure 34 by immersing in a platinum electroless plating solution a Si substrate 14 with a Pd alloy underlayer 13 having an (Al, Si) mixture thin film formed thereon (see FIGS. 10A to 10D).

First, Pt was selected as a metal other than Pd for using a Pd alloy film for the underlayer 13 having a catalytic activity, and a Pd alloy underlayer with the thickness of 20 nm was formed on the Si substrate 14 by the sputtering method. Three types of thin Pd alloy underlayers having composition ratios of 2:1, 1:1 and 1:2, respectively, as the composition ratio of Pd:Pt were formed (see FIG. 10A). Further, an (Al, Si) mixture thin film 24 with the thickness of 100 nm having the composition ratio of Al:Si of 3:2 was formed on the Si substrate 14 with the three types of thin Pd alloy underlayers (see FIG. 10B). Hereinafter, they are referred to as "bases".

The surface of the base was observed by a FE-SEM and as a result, it was found that for all the bases, columnar members 21 with the diameter of about 5 nm and the center-to-center distance of 10 nm having Al as a main component were formed in a large number in the surface of a matrix 22 having Si as a main component (see FIG. 9A). The cross section of the base was observed and as a result, it was found that columnar members 21 having Al as a main component were formed vertically to the Si substrate 14 from the thin Pd alloy underlayer (see FIG. 9B).

Then, as a method for preparation of a platinum electroless plating solution, 100 mL of Rectroless Pt 100 base solution (Nippon Electroplating Engineers Co Ltd.), 10 mL of 28% aqueous ammonia, 2 mL of Rectroless Pt 100 reducing agent (Nippon Electroplating Engineers Co Ltd.) and 88 mL of pure water were mixed together to prepare a platinum electroless plating solution. The pH of the plating solution was 12.

Subsequently, the platinum electroless plating solution was heated and set at 60° C. In this state, the base was immersed in the plating solution for 1 hour. This sample was observed by the FE-SEM and as a result, it was found that for all the bases, platinum columnar structures 33 were formed in pores 31 formed as a result of dissolution of columnar members 21 having Al as a main component in the base.

Platinum columnar structures 33 could be obtained on all three types of thin Pd alloy underlayers having composition ratios of Pd:Pt of 2:1, 1:1 and 1:2, respectively, and they each had a diameter of about 5 nm. The center-to-center distance was about 10 nm (see FIG. 10D).

As described above, the platinum columnar structure 33 can be formed even if the composition ratio of Pd:Pt in the thin Pd alloy underlayer is changed.

EXAMPLE 10

This Example describes, as one example, an example of fabricating a nanostructure 33 by immersing in a platinum electroless plating solution a Si substrate 14 with a Pd underlayer 13 having an (Al, Ge) mixture thin film 24 formed thereon (see FIGS. 10A to 10D).

For example, an (Al, Ge) mixture thin film 32 with the thickness of 100 nm having the composition ratio of Al:Ge of 3:2 is formed on a Si substrate 33 with a thin Pd underlayer (thickness 20 nm) by the sputtering method (see FIG. 10B). Hereinafter, a set of the structure on the substrate is referred to as a "base".

Figure 9B:
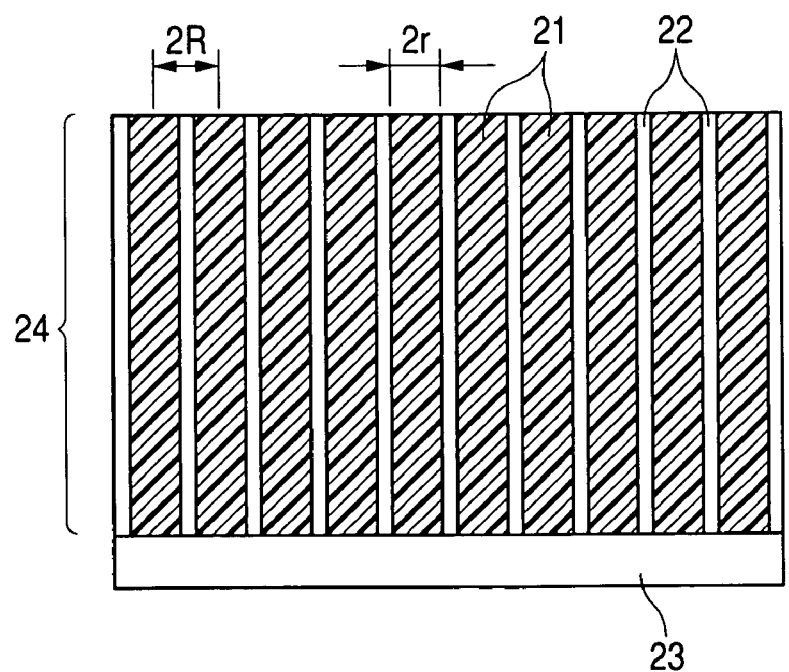

The surface of the base was observed by a FE-SEM and as a result, it was found that columnar members 21 with the diameter of about 10 nm and the center-to-center distance of about 15 nm having Al as a main component were formed in a large number in a matrix 22 having Ge as a main component as in the case of Example 6 (see FIG. 9A) The cross section of the base was observed and as a result, it was found that columnar members 21 having Al as a main component were formed vertically to the Si substrate 14 from the Pd underlayer 13 (see FIG. 9B).

Then, as a method for preparation of a platinum electroless plating solution, 100 mL of Rectroless Pt 100 base solution (Nippon Electroplating Engineers Co Ltd.), 10 mL of 28% aqueous ammonia, 2 mL of Rectroless Pt 100 reducing agent (Nippon Electroplating Engineers Co Ltd.) and 88 mL of pure water were mixed together to prepare a platinum electroless plating solution. The pH of the plating solution was 12.

Subsequently, the platinum electroless plating solution was heated and set at 60° C. In this state, the base was immersed in the plating solution for 1 hour. This sample was observed by the FE-SEM and as a result, it was found that platinum columnar structures 33 were formed in pores 31 formed as a result of dissolution of columnar members 21 having Al as a main component in the base. The platinum columnar structure 33 had a diameter of about 10 nm and a height of about 70 nm. The center-to-center distance was about 15 nm (see FIG. 10D).

As described above, by controlling the time of immersion in the platinum electroless plating solution, the pH of the plating solution, the temperature of the plating solution and the stirring speed in accordance with the thickness of the (Al, Ge) mixture thin film 24 formed by control of the composition ratio between Al and Ge and the thickness, the nanostructure 34 having formed therein the platinum columnar structure 33 having a desired size can be formed. The nanostructure 34 having a desired size can be formed similarly even if electroless plating of a metal other than platinum is carried out.

In the case of an (Al, Si, Ge) mixture thin film, by controlling the time of immersion in the platinum electroless plating solution, the pH of the plating solution, the temperature of the plating solution and the stirring speed in accordance with the thickness of the (Al, Si, Ge) mixture thin film 24 formed by control of the composition ratio of Al:Si:Ge and the thickness, the nanostructure 34 having formed therein the platinum columnar structure 33 having a desired size can be formed. The nanostructure 34 having a desired size can be formed similarly even if electroless plating of a metal or oxide other than platinum is carried out.

EXAMPLE 11

This Example describes, as one example, an example of fabricating a nanostructure 34 by etching a Si substrate 14 with a Pd underlayer 13 having an (Al, Si) mixture thin film 24 formed thereon, and then immersing the substrate 14 in a CoNiB electroless plating solution (see FIGS. 10A to 10D).

For example, the (Al, Si) mixture thin film 24 with the thickness of 100 nm and the atomic weight ratio of Al:Si of 3:2 is formed on the Si substrate 14 with the Pd underlayer 13 (thickness 20 nm) by the sputtering method (see FIG. 10B). Hereinafter, a set of the structure on the substrate is referred to as a "base".

The surface of the base was observed by a FE-SEM and as a result, it was found that columnar members 21 with the diameter of about 5 nm and the center-to-center distance of about 10 nm having Al as a main component were formed in a large number in the surface of a matrix 22 having Si as a main component (see FIG. 9A). The cross section of the base was observed and as a result, it was found that columnar members 21 having Al as a main component were formed vertically to the Si substrate 14 from the Pd underlayer 13 (see FIG. 9B).

Then, the base was immersed in 5 wt % phosphoric acid set at 25° C. for 6 hours to etch the base. The cross section of this sample was observed by the FE-SEM and as a result, it was found that columnar members 21 having Al as a main component were fully dissolved to form pores 31 with the diameter of about 5 nm and the center-to-center distance of about 10 nm (see FIG. 10C).

Then, as a method for preparation of a CoNiB electroless plating solution, 0.03 mol/l of cobalt sulfate, 0.07 mol/l of nickel sulfate, 0.2 mol/l of sodium hypophosphite, 0.2 mol/l of sodium citrate and 0.5 mol/l of borax were mixed together to prepare a CoNiB electroless plating solution. Further, the pH of the electroless plating solution was set to 7 by addition of sodium hydroxide. The electroless plating solution was heated and set at 90° C. In this state, the base was immersed in the plating solution for 30 minutes.

This sample was observed by the FE-SEM and as a result, it was found that CoNiB columnar structures 33 were formed in pores 31 formed as a result of dissolution of columnar member 21 parts having Al as a main component in the base (see FIG. 10D). The columnar structure 33 had a diameter of about 5 nm and a height of about 100 nm. The center-to-center distance was about 10 nm.

A magnetic field was applied to the CoNiB columnar structure 33 and measured and as a result, it was found that ferromagnetic characteristics with perpendicular ferromagnetic anisotropy was exhibited, which indicates that a magnetic device used as a densificated perpendicular magnetic recording medium is provided.

As described above, the columnar structure 33 having mixed together two or more types of metals such as CoNiB and CoNiP can be formed in the pore 31 having the Al (Si, Ge) mixture thin film 24 formed therein by electroless plating, and therefore the nanostructure 34 described above can provide a magnetic device.

EXAMPLE 12

This Example describes, as one example, an example of fabricating a nanostructure 34 by etching a glass substrate 14 with a Pd underlayer 13 having an (Al, Si) mixture thin film 24 formed thereon, and then immersing the substrate 14 in a ZnO electroless plating solution (see FIGS. 10A to 10D).

For example, the (Al, Si) mixture thin film 24 with the thickness of 100 nm and the atomic weight ratio of Al:Si of 3:2 is formed on the Si substrate 14 with the Pd underlayer 13 (thickness 5 nm) by the sputtering method (see FIG. 10B). Hereinafter, a set of the structure on the substrate is referred to as a "base".

The surface of the base was observed by a FE-SEM and as a result, it was found that columnar members 21 with the diameter of about 5 nm and the center-to-center distance of about 10 nm having Al as a main component were formed in a large number in the surface of a matrix 22 having Si as a main component (see FIG. 9A). The cross section of the base was observed and as a result, it was found that columnar members 21 having Al as a main component were formed vertically to the glass substrate 14 from the Pd underlayer 13 (see FIG. 9B).

Then, the base was immersed in 5 wt % phosphoric acid set at 25° C. for 6 hours to etch the base. The cross section of this sample was observed by the FE-SEM and as a result, it was found that columnar members 21 having Al as a main component were fully dissolved to form pores 31 with the diameter of about 5 nm and the center-to-center distance of about 10 nm (see FIG. 10C).

Then, as a method for preparation of a ZnO electroless plating solution, 0.05 mol/l of zinc nitrate and 0.05 mol/l of dimenilamine borane were mixed together to prepare a ZnO electroless plating solution. The electroless plating solution was heated and set at 65° C. In this state, the base was immersed in the plating solution for 40 minutes.

This sample was observed by the FE-SEM and as a result, it was found that ZnO columnar structures 33 were formed in pores 31 formed as a result of dissolution of columnar members 21 having Al as a main component in the base (see FIG. 10D). The columnar structure 33 had a diameter of about 5 nm and a height of about 90 nm. The center-to-center distance was about 10 nm.

The base was measured for photoluminescence with a He—Cd laser as an excitation source and as a result, interband emission of light at the wavelength of around 385 nm and emission of green light at the wavelength of around 500 nm to 550 nm could be observed from the base, and therefore the base can be used as a light emitting device.

As described above, the ZnO columnar structure 33 can be formed in the pore 31 of the Al (Si, Ge) mixture thin film 24 by electroless plating, and therefore by using the nanostructure 34 described above, optical devices capable of exhibiting functionality, such as light emitting devices, photoelectric conversion elements and photocatalytic elements, can be provided.

This application claims priority from Japanese Patent Application No. 2003-290536 filed on Aug. 8, 2003 and No. 2003-290538 filed on Aug. 8, 2003, which are hereby incorporated by reference herein.

What is claimed is:
1. A catalytic structure comprising:
a substrate or a substrate having an underlayer; and
a structure formed on the substrate or the underlayer, wherein the structure includes: a columnar first part having a plurality of spaced columns, and a second part formed to surround the columns of the first part, the second part includes two or more types of materials that form a eutectic material, in which one or more of the two or more types of materials is a semiconductor material, and in which the eutectic material has a eutectic point of about 300° or greater, the first part exhibits catalytic activity and does not include Si, a height of the first part as measured from the substrate is greater than a height of the second part as measured from the substrate or the underlayer, and a distance between centers of each pair of adjacent columns is in a range of 5 nm to 20 nm.

2. The structure according to claim 1, wherein the semiconductor material includes Si, or Ge, or Si and Ge.

3. The structure according to claim 1, wherein an average diameter of the columns is 20 nm or less.

4. The structure according to claim 1, wherein the height of the first part from the substrate or the underlayer is 1 μm or less.

5. The structure according to claim 1, wherein the first part includes a metal or an alloy.

6. The structure according to claim 1, wherein the first part includes Pd or Pt.

* * * * *